United States Patent
Miyazawa et al.

(10) Patent No.: US 6,873,054 B2
(45) Date of Patent: Mar. 29, 2005

(54) SEMICONDUCTOR DEVICE AND A METHOD OF MANUFACTURING THE SAME, A CIRCUIT BOARD AND AN ELECTRONIC APPARATUS

(75) Inventors: Ikuya Miyazawa, Chino (JP); Tadayoshi Ikehara, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 5 days.

(21) Appl. No.: 10/417,190

(22) Filed: Apr. 17, 2003

(65) Prior Publication Data

US 2004/0016942 A1 Jan. 29, 2004

(30) Foreign Application Priority Data

Apr. 24, 2002 (JP) ....................... 2002-121901

(51) Int. Cl.⁷ ............................................ H01L 23/48
(52) U.S. Cl. ...................... 257/774; 257/621; 257/622; 257/667; 257/680; 257/774; 174/255
(58) Field of Search ................. 257/621, 622, 257/667, 680, 774; 174/255

(56) References Cited

U.S. PATENT DOCUMENTS

| | | | |
|---|---|---|---|
| 6,693,358 B2 | * | 2/2004 | Yamada et al. ............. 257/774 |
| 2001/0023779 A1 | * | 9/2001 | Sugaya et al. |
| 2002/0084513 A1 | * | 7/2002 | Siniaguine |

OTHER PUBLICATIONS

Siniaguine, Integrated circuits and methods for their fabrication, Jul. 4, 2002, Pub. No. US 2002/0084513.*
Sugaya et al., Transfer material, method for producing the same and wiring substrate produced by using the same, Sep. 27, 2001, Pub. No. US 2001/0023779.*

* cited by examiner

Primary Examiner—David Nelms
Assistant Examiner—Mai-Huong Tran
(74) Attorney, Agent, or Firm—Oliff & Berridge, PLC

(57) ABSTRACT

A through hole tapered from an opening to the in-depth direction is formed in a semiconductor substrate provided with an integrated circuit. An insulating material is supplied to the through hole through the opening so as to form an insulating layer on the inner surface of the through hole. A conductive material is supplied through the opening to the through hole provided with the insulating layer so as to form a conductive portion inside the insulating layer.

13 Claims, 6 Drawing Sheets

SEMICONDUCTOR DEVICE AND A METHOD OF MANUFACTURING THE SAME, A CIRCUIT BOARD AND AN ELECTRONIC APPARATUS

BACKGROUND OF THE INVENTION

The present invention relates to a semiconductor device and a method of manufacturing the same, a circuit board and an electronic apparatus.

Three-dimensionally mounted semiconductor devices are being developed. Further, in an attempt to realize the three-dimensional mounting, forming a through electrode in, a semiconductor chip is well known. More specifically, a through hole is formed in the semiconductor chip, and an insulating layer is formed on the inner face of the through hole. The through electrode is then formed inside the insulating layer. In this case, it has been difficult to form the insulating layer on the inner face of the small through hole and to form the conductive electrode inside the insulating layer.

BRIEF SUMMARY OF THE INVENTION

A semiconductor device manufacturing method according to an aspect of the present invention comprises:
  (a) forming a through hole tapered from an opening to an in-depth direction in a semiconductor substrate provided with an integrated circuit;
  (b) forming an insulating layer on an inner surface of the through hole by supplying an insulating material to the through hole through the opening; and
  (c) forming a conductive portion inside the insulating layer by supplying a conductive material through the opening to the through hole provided with the insulating layer.

In a semiconductor device manufacturing method according to an aspect of the present invention, a plurality of semiconductor devices manufactured by the above method is stacked such that each of the plurality of semiconductor devices is electrically connected to another through the conductive portion.

A semiconductor device according to an aspect of the present invention is manufactured by the above method.

A semiconductor device according to an aspect of the present invention comprises:
  a semiconductor substrate provided with an integrated circuit and a through hole tapered from an opening to an in-depth direction;
  an insulating layer provided on an inner surface of the through hole; and
  a conductive portion provided on an inner surface of the insulating layer.

In a semiconductor device according to an aspect of the present invention, a plurality of semiconductor devices manufactured by the above method are stacked such that each of the plurality of semiconductor devices is electrically connected to another through the conductive portion.

A circuit board according to an aspect of the present invention is formed by mounting the above semiconductor device thereon.

An electronic apparatus according to an aspect of the present invention comprises the above semiconductor device.

DETAILED DESCRIPTION OF THE EMBODIMENT

Figure 1A:
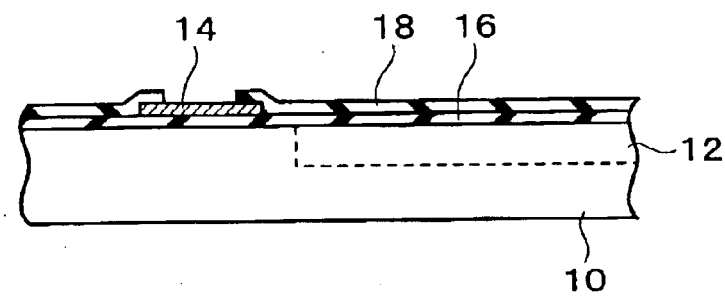
FIG. 1A through FIG. 1E illustrate a semiconductor device manufacturing method of an embodiment to which the present invention is applied.

The embodiment of the present invention resolves the above conventional problems and is intended for forming the through electrode with ease.

(1) A semiconductor device manufacturing method according to an embodiment of the present invention comprises:
  (a) forming a through hole tapered from an opening to an in-depth direction in a semiconductor substrate provided with an integrated circuit;
  (b) forming an insulating layer on an inner surface of the through hole by supplying an insulating material to the through hole through the opening; and
  (c) forming a conductive portion inside the insulating layer by supplying a conductive material through the opening to the through hole provided with the insulating layer.

According to an embodiment of the invention, since the opening of the through hole is open wide, and it is easy to supply the insulating material and the conductive material, a through electrode can easily be formed.

(2) In the semiconductor device manufacturing method, the through hole may be formed by a method including a sandblast process.

(3) In the semiconductor device manufacturing method, a concave portion tapered by the sandblast process may be formed in the semiconductor substrate, and the through hole may be formed by performing a laser process on a bottom surface of the concave portion.

(4) In the semiconductor device manufacturing method, the semiconductor substrate may include an electrode on a first surface thereof, and the through hole may be formed in a second surface, which is opposite to the first surface of the semiconductor substrate provided with the electrode.

(5) In the semiconductor device manufacturing method, the through hole may be formed so as to penetrate the electrode.

(6) In the semiconductor device manufacturing method, the through hole may be formed such that an angle between a surface of the semiconductor substrate and an inner wall surface of the through hole is 70 degrees or more and less than 90 degrees.

(7) The semiconductor device manufacturing method may further comprise: forming the conductive portion such that the conductive portion corresponds to each of the plurality of integrated circuits formed in the semiconductor substrate which is a semiconductor wafer; and cutting the semiconductor substrate after the process (C).

(8) In a semiconductor device manufacturing method according to an embodiment of the present invention, a plurality of semiconductor devices manufactured by the above method is stacked such that each of the plurality of semiconductor devices is electrically connected to another through the conductive portion.

(9) A semiconductor device according to an embodiment of the present invention is manufactured by the above method.

(10) A semiconductor device according to an embodiment of the present invention comprises:
  a semiconductor substrate provided with an integrated circuit and a through hole tapered from an opening to an in-depth direction;
  an insulating layer provided on an inner surface of the through hole; and
  a conductive portion provided on an inner surface of the insulating layer.

(11) In a semiconductor device according to an embodiment of the present invention, a plurality of semiconductor devices manufactured by the above method are stacked such that each of the plurality of semiconductor devices is electrically connected to another through the conductive portion.

(12) A circuit board according to an embodiment of the present invention is formed by mounting the above semiconductor device thereon.

(13) An electronic apparatus according to an embodiment of the present invention comprises the above semiconductor device.

The following describes embodiments of the present invention with reference to drawings. FIG. 1A through FIG. 3D illustrate a method of manufacturing a semiconductor device according to an embodiment to which the present invention is applied. The embodiment employs a semiconductor substrate 10. The semiconductor substrate 10 shown in FIG. 1A may be a semiconductor wafer; however, it may be a semiconductor chip. The semiconductor substrate 10 is provided with at least one (more than one for a semiconductor wafer, one for a semiconductor chip) integrated circuit (a circuit including a transistor and a memory, for example) 12. The semiconductor substrate 10 is provided with a plurality of electrodes (pads, for example) 14. Each of the electrodes 14 is electrically connected to the integrated circuit 12. Each electrode 14 may be formed of aluminum. The shape of the electrode 14 is not particularly limited, but it is rectangular in many cases. When the semiconductor substrate 10 is a semiconductor wafer, 2 or more electrodes 14 (one group) are formed in each of the regions corresponding to a plurality of semiconductor chips.

The semiconductor substrate 10 is provided with one or more layers of passivation films 16 and 18. The passivation films 16 and 18 may be formed from $SiO_2$, SiN, or polyimide resin. In the example shown in FIG. 1A, the electrode 14 and wiring (not shown in the figure) for connecting the electrode 14 and the integrated circuit 12 are formed on the passivation film 16. Moreover, the other passivation film 18 is formed, avoiding at least a portion of the surface of the electrode 14. After the passivation film 18 is formed to cover the surface of the electrode 14, part of the passivation film 18 may be etched, such that the portion of the electrode 14 is exposed. Dry etching or wet etching may be employed for the etching. When etching the passivation film 18, the surface of the electrode 14 may also be etched.

Figure 1B:
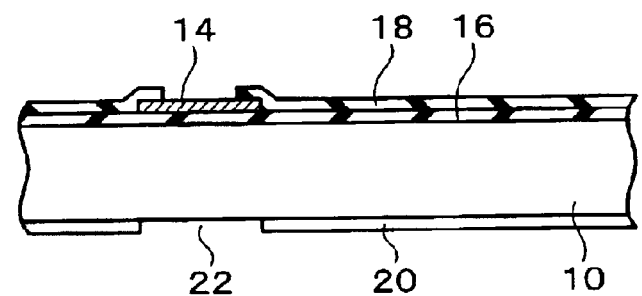

In the present embodiment, a through hole 30 (see FIG. 1D) is formed in the semiconductor substrate 10. For this purpose, a resist 20 may be formed on the semiconductor substrate 10 as shown in FIG. 1B. The resist 20 may be formed on the second surface, which is opposite to the first surface where the electrode 14 is formed. The resist 20 is patterned so as to include an opening 22. The opening 22 may be formed so as to overlap at least partially with the electrode 14. The through hole 30 is then formed inside the opening 22.

Figure 1C:
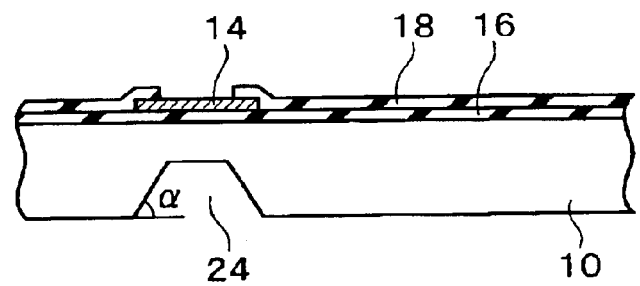

A concave portion 24 may be formed in the semiconductor substrate 10 in order to form the through hole 30 as shown in FIG. 1C. The concave portion 24 is formed so as to be tapered from the opening to the in-depth direction. Specifically, the concave portion 24 has its opening wider than its bottom surface. The angle α between the surface (the second surface) of the semiconductor substrate 10 and the inner wall face of the concave portion 24 may be 70 degrees or more and less than 90 degrees. The concave portion 24 with such a shape maybe formed by sandblast process.

Figure 1D:
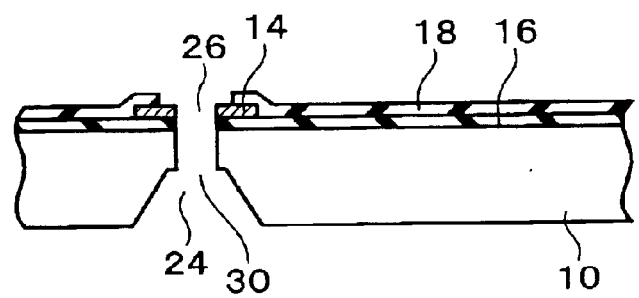

A through slit 26 is formed at the bottom of the concave portion 24 as shown in FIG. 1D. When forming the through slit, laser (such as YAG laser, $CO_2$ laser, and excimer laser) may be used, or etching (dry etching or wet etching) may be performed. The through slit 26 maybe formed so as to penetrate the electrode 14. The through hole 30 is made in the semiconductor substrate 10 with the concave portion 24 and the through slit 26. Part of the inner wall surface of the through hole 30 is also the inner wall surface of the concave portion 24. Therefore, the through hole 30 is tapered from the opening to the in-depth direction. The through hole 30 penetrates the electrode 14.

Figure 1E:
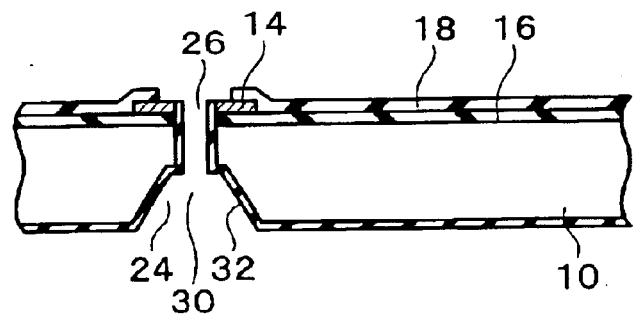

An insulating layer 32 is formed on the inner surface of the through hole 30 as shown in FIG. 1E. The insulating layer 32 may reach the surface (the second surface) of the semiconductor substrate 10 on the side opposite to the electrode 14. When the through hole 30 penetrates the electrode 14, the insulating layer 32 may be formed also on the inner surface of the hole made in the electrode 14. However, the insulating layer 32 is formed such that at least part of the electrode 14 (the surface, for example) is exposed. The insulating layer 32 is formed by supplying an insulating material into the through hole 30. The insulating material is supplied through the opening of the tapered through hole 30 (opening of the concave portion 24). In this manner, the insulating material can be supplied through the wide opening, thereby facilitating formation of the insulating layer 32. The insulating material can be applied by the screen printing method, the ink-jet printing method, the chemical vapor deposition (CVD), the spray method, or the dispenser.

Figure 2A:
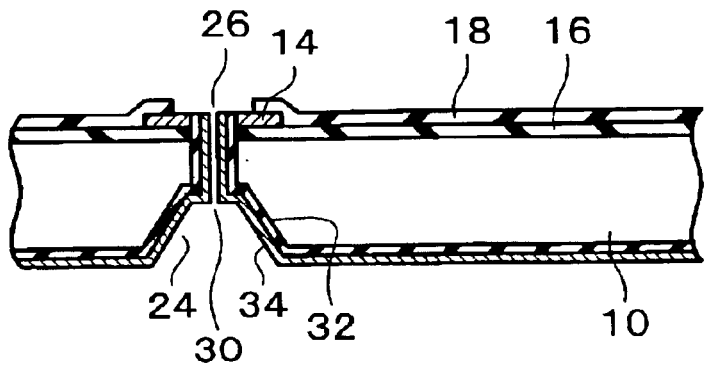
FIG. 2A through FIG. 2D illustrate the semiconductor device manufacturing method of the embodiment to which the present invention is applied.

As shown in FIG. 2A, a conductive layer 34 is formed on the insulating layer 32. The conductive layer 34 is formed at least inside the through hole 30. Forming the conductive layer 34 includes supplying a conductive material into the through hole 30. The conductive material may be applied by the screen printing method, the ink-jet printing method, the chemical vapor deposition (CVD), the spray method or the dispenser. The conductive layer 34 may include at least a barrier layer. The barrier layer prevents a material to be provided thereon from spreading on the semiconductor substrate 10 (Si, for example). The barrier layer may be formed of material (TiW, TiN, for example) different from the material to be formed thereon. The conductive layer 34 may include a seed layer. The seed layer is formed after the barrier layer is formed. Also, the seed layer may be formed of the same material (Cu, for example) as a material to be formed thereon. The conductive layer 34 may be provided in a manner to avoid filling the through hole 30. Specifically, the through slit may be formed inside the through hole 30, being surrounded by the conductive layer 34. When forming the conductive layer 34 only on the insulating layer 32, the conductive layer 34 is not electrically connected to the electrode 14.

Figure 2B:
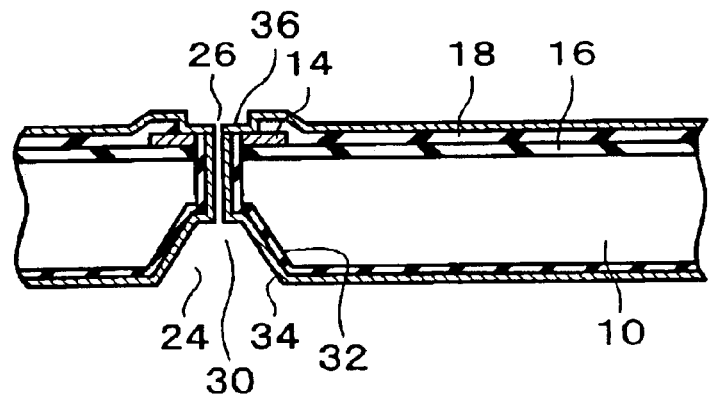

A conductive layer (the second conductive layer) 36 is formed on the conductive layer (the first conductive layer) 34 and the electrode 14 as shown in FIG. 2B. The content of the conductive layer 36 is that of the conductive layer 34. Also, the conductive layer 36 may reach the passivation film 18. The conductive layer 36 may be formed in a manner to avoid covering the through hole 30. Specifically, a hole communicating with the through hole 30 may be formed in the conductive layer 36.

Figure 2C:
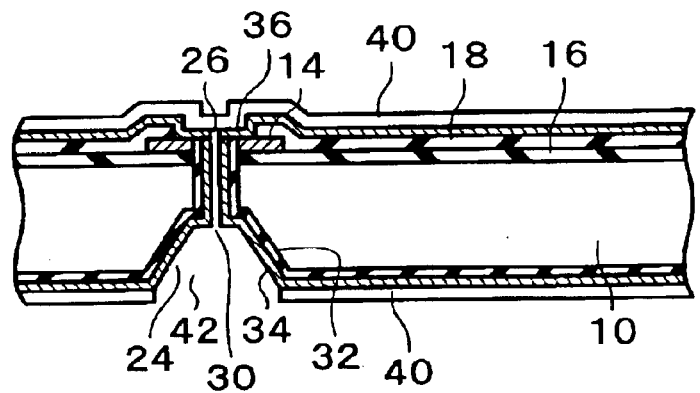

A resist 40 is formed as shown in FIG. 2C. The resist 40 is patterned so as to include an opening 42. The opening 42 overlaps with the through hole 30. The resist 40 may cover the conductive layers 34 and 36 except in the area of the through hole 30.

Figure 2D:
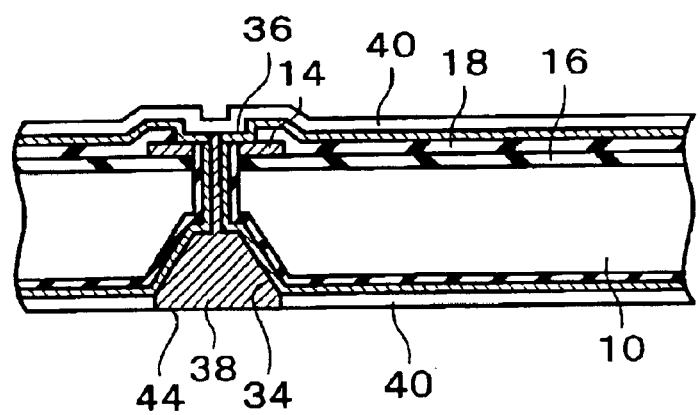

As shown in FIG. 2D, a conductive material is supplied to the inside of the through hole 30 so as to form a conductive layer (the third conductive layer) 38. The conductive layer 38 may be formed from Cu, for example. Also, the conductive layer 38 may be formed by the electroless plating or the ink-jet method. The conductive layer 38 may protrude from the second surface of the semiconductor substrate 10 (the surfaces of the insulating layer 32 and the conductive layer 34, for example), which is opposite to the first surface where the electrode 14 is formed.

A conductive portion 44 can be formed through the above steps. The conductive portion 44 is intended for electrically connecting the both surfaces of the semiconductor substrate 10. In the present embodiment, the conductive layers 34, 36 and 38 form the conductive portion 44. A conductive material is supplied through the opening of the tapered through hole 30 where the insulating layer 32 is formed so as to form a through electrode 44. Since the conductive material is supplied through the wide opening in this manner, the conductive portion 44 can therefore easily be formed.

Figure 3A:
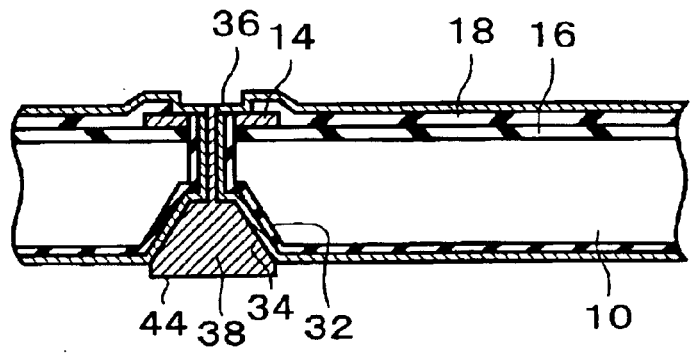
FIG. 3A through FIG. 3D illustrate the semiconductor device manufacturing method of the embodiment to which the present invention is applied.
Figure 3B:
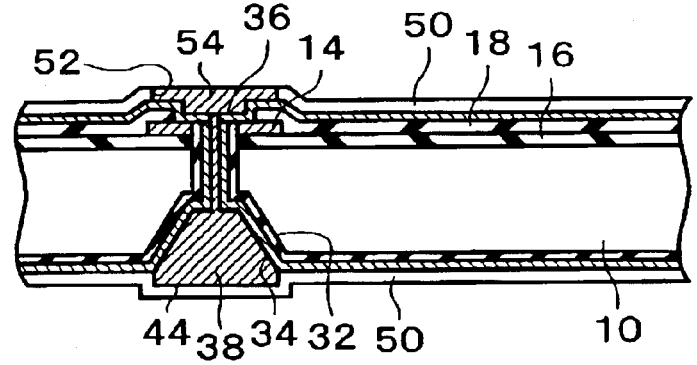

The resist 40 is removed as shown in FIG. 3A, and another resist 50 may be formed as shown in FIG. 3B. The resist 50 is patterned to include an opening 52. The opening 52 overlaps at least partially with the electrode 14. The resist 50 may also cover the conductive layers 34, 36 and 38 except at least in a portion of the electrode 14. A conductive layer 54 (the forth conductive layer) is formed inside the opening 52 (on the electrode 14 or on the conductive layer 36 formed thereon). The conductive layer 54 may be formed by the electroless plating or the ink-jet method. The conductive layer 54 may protrude from the first surface of the semiconductor substrate 10 where the electrode 14 is formed (for example, the surface of the passivation film 18 or the conductive layer 36).

Figure 3C:
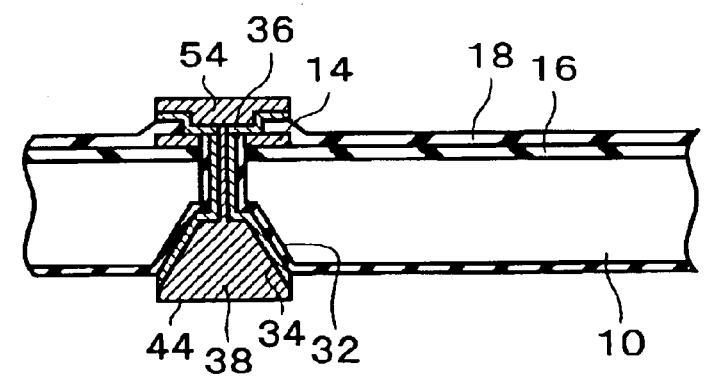

As shown in FIG. 3C, the resist 50 is removed. Also, part of the conductive layer 34 formed under the conductive layer 38 (the portion outside the conductive layer 38) may be removed (etched, for example), using the conductive layer 38 as a mask. Similarly, part of the conductive layer 36 formed below the conductive layer 54 (the portion outside the conductive layer 54) may be removed (etched, for example), using the conductive layer 54 as a mask.

Figure 3D:
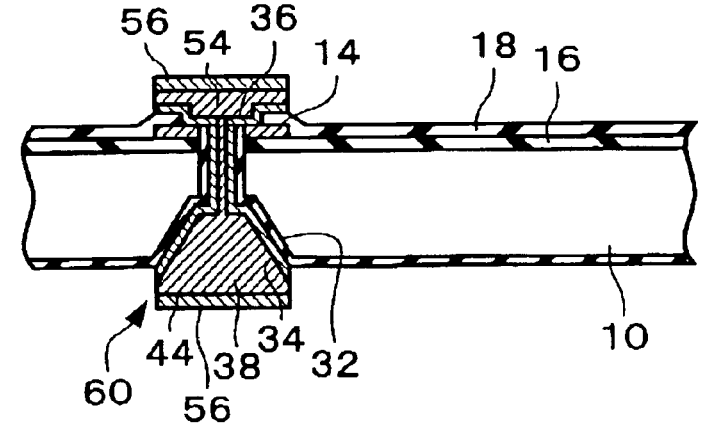

As shown in FIG. 3D, a brazing filler metal (soft solder or hard solder) 56 may be provided on the conductive portion 44 (or the conductive layer 38). The brazing filler metal 56 may also be provided on the conductive layer 54 on the side of the electrode 14.

A through electrode 60 is formed through the above steps. In the present embodiment, the through electrode 60 includes the conductive portion 44 (the conductive layers 34, 36 and 38) and the conductive layer 54 and may also include the brazing filler metal 56. The through electrode 60 penetrates the semiconductor substrate 10, being able to electrically connect the first surface provided with the electrode 14 and the second surface opposite to the first surface. The through electrode 60 may protrude from the both surfaces of the semiconductor substrate 10. The through electrode 60 penetrates the electrode 14, being electrically connected thereto. The through electrode 60 is also provided inside the through hole 30 of the semiconductor substrate 10 (see FIG. 1D). The insulating layer 32 electrically insulates the semiconductor substrate 10 and the through electrode 60 from each other.

Figure 4:
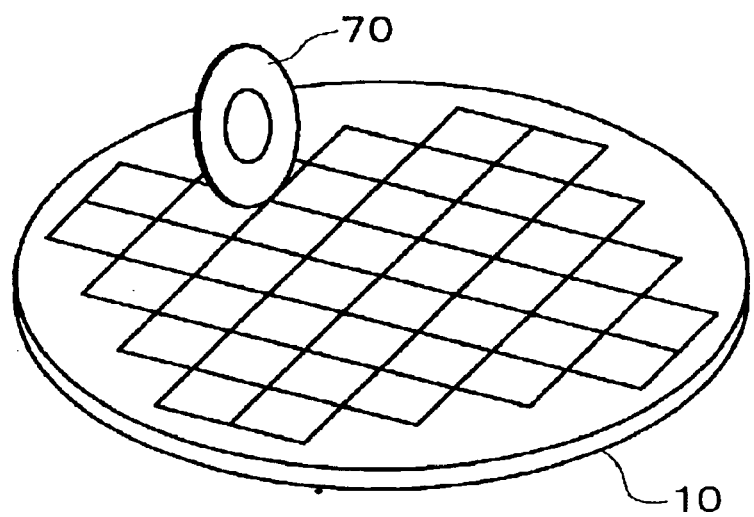
FIG. 4 illustrates the semiconductor device manufacturing method of the embodiment to which the present invention is applied.

When the semiconductor substrate 10 is a semiconductor wafer as shown in FIG. 4, the through hole 30 is formed corresponding to each integrated circuit 12 (see FIG. 1A), and then the through electrode 60 is formed. Then, the semiconductor substrate 10 may be cut (dicing, for example). A cutter (dicer, for example) 70 or laser ($CO_2$ laser, YAG laser, for example) may be employed for cutting the semiconductor substrate 10.

A semiconductor device can be manufactured through the above steps. The semiconductor device includes the semiconductor substrate 10. The semiconductor substrate 10 is provided with the through hole 30, which is tapered from the opening to the in-depth direction. The insulating layer 32 is formed inside the through hole 30. The conductive portion 44 is formed inside the insulating layer 32. The rest of the configuration can be realized by the above manufacturing method.

Figure 5:
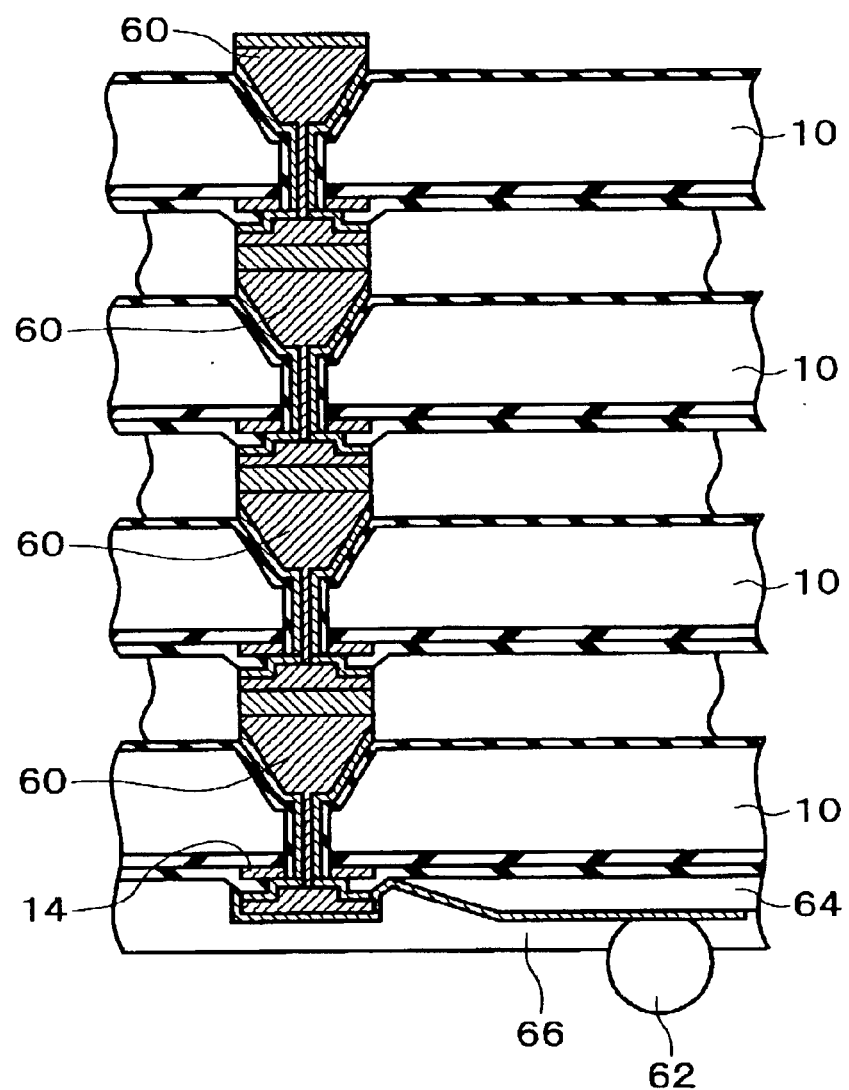
FIG. 5 illustrates semiconductor devices of the embodiment to which the present invention is applied.

Moreover, as shown in FIG. 5, a plurality of semiconductor devices manufactured by the above method may be stacked on each other and electrically connected to each other through the through electrodes 60. The present embodiment is particularly effective when implementing such three-dimensional mounting. The semiconductor devices shown in FIG. 5 include the plurality of semiconductor substrates 10. The semiconductor substrate 10 located at the outermost side (the bottom side in FIG. 5) in the direction of the electrode 14 (the first surface) includes an external terminal (for example, solder bold) 62. The external terminal 62 is provided on a wiring 66 formed on a resin layer (stress relaxation layer) 64. The wiring 66 is connected to the through electrode 60 on the side of the electrode 14.

Figure 6:
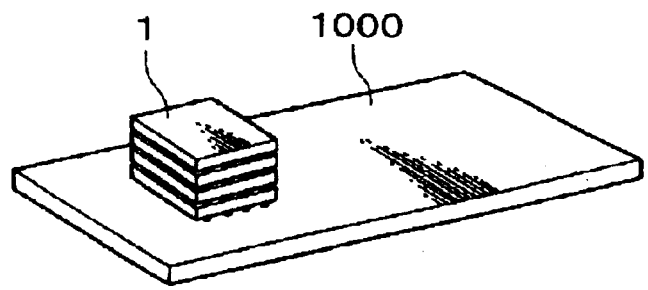
FIG. 6 illustrates a circuit board according to an embodiment of the present invention.
Figure 7:
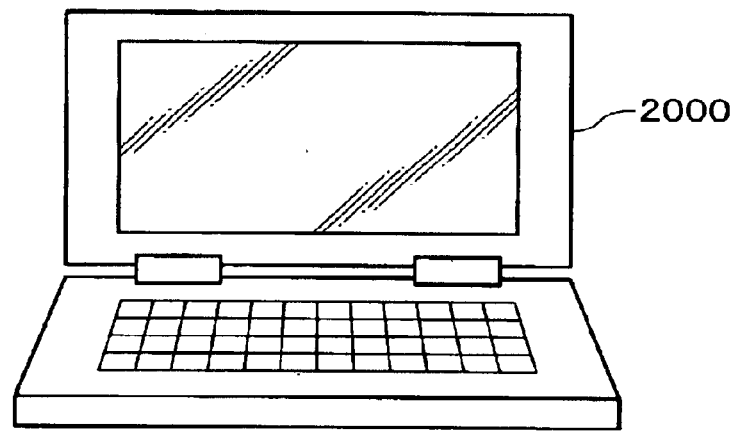
FIG. 7 illustrates an electronic apparatus according to an embodiment of the present invention.
Figure 8:
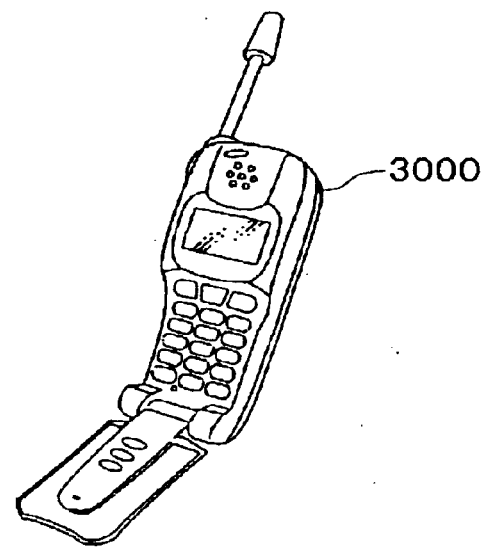
FIG. 8 illustrates an electronic apparatus according to an embodiment of the present invention.

FIG. 6 shows a circuit board 1000 on which a semiconductor device 1 is mounted, and the semiconductor device 1 is formed by stacking a plurality of semiconductor chips on each other. The above mentioned through electrodes 60 electrically connect the plurality of semiconductor chips. As electronic apparatuses including the above semiconductor device, FIG. 7 shows a laptop personal computer 2000 while FIG. 8 illustrates a cellular phone 3000.

The present invention is not limited to the above embodiments and can be modified in various manners. For example, the present invention includes a structure that is substantially the same as the structure explained in the above embodiments (for example, a structure characterized in the same function, method and result, or a structure characterized in the same purpose and result). Also, the present invention includes a structure including a part that replaces a nonessential part of the structure explained in the above embodiments. The present invention includes a structure yielding the same effects or achieving the same goals as those of the structure explained in the above embodiments. Also, the present invention includes a structure formed by adding prior art technology to the structure explained in the above embodiments.

What is claimed is:

1. A semiconductor device manufacturing method comprising:
   (a) forming a through hole tapered from an opening to an in-depth direction in a semiconductor substrate provided with an integrated circuit, the through hole comprising a tapered portion and a straight portion, the straight portion defined by sidewalls that are generally perpendicular to a surface of the semiconductor substrate;
   (b) forming an insulating layer on an inner surface of the through hole by supplying an insulating material to the through hole through the opening; and
   (c) forming a conductive portion inside the insulating layer by supplying a conductive material through the opening to the through hole provided with the insulating layer.

2. A semiconductor device manufacturing method comprising:
   (a) forming a through hole tapered from an opening to an in-depth direction in a semiconductor substrate provided with an integrated circuit, wherein the through hole is formed by a method including a sandblast process;
   (b) forming an insulating layer on an inner surface of the through hole by supplying an insulating material to the through hole through the opening; and
   (c) forming a conductive portion inside the insulating layer by supplying a conductive material through the opening to the through hole provided with the insulating layer.

3. The semiconductor device manufacturing method according to claim 2, wherein a concave portion tapered by the sandblast process is formed in the semiconductor substrate, and the through hole is formed by performing a laser process on a bottom surface of the concave portion.

4. The semiconductor device manufacturing method according to claim 1,
   wherein the semiconductor substrate includes an electrode on a first surface thereof, and
   wherein the through hole is formed in a second substrate, which is opposite to the first surface of the semiconductor substrate provided with the electrode.

5. The semiconductor device manufacturing method according to claim 4, wherein the through hole is formed so as to penetrate the electrode.

6. The semiconductor device manufacturing method according to claim 1, wherein the through hole is formed, such that an angle between a surface of the semiconductor substrate and an inner wall surface of the through hole is 70 degrees or more and less than 90 degrees.

7. The semiconductor device manufacturing method according to claim 1, further comprising:
   forming the conductive portion such that the conductive portion corresponds to each of the plurality of integrated circuits formed in the semiconductor substrate which is a semiconductor wafer; and
   cutting the semiconductor substrate after the process (C).

8. A semiconductor device manufacturing method, wherein a plurality of semiconductor devices manufactured by the method according to claim 1 are stacked such that each of the plurality of semiconductor devices is electrically connected to another through the conductive portion.

9. A semiconductor device manufacturing by the method according to claim 1.

10. A semiconductor device comprising:
    a semiconductor substrate provided with an integrated circuit and a through hole tapered from an opening to an in-depth direction, the through hole comprising a tapered portion and a straight portion, the straight portion defined by sidewalls that are generally perpendicular to a surface of the semiconductor substrate;
    an insulating layer provided on an inner surface of the through hole; and
    a conductive portion provided on an inner surface of the insulating layer.

11. A semiconductor device, wherein a plurality of semiconductor devices according to claim 10 is stacked such that each of the plurality of semiconductor devices is electrically connected to another through the conductive portion.

12. A circuit board on which the semiconductor device according to claim 10 is mounted.

13. An electronic apparatus comprising the semiconductor device according to claim 10.

* * * * *